United States Patent [19]
Oh et al.

[11] Patent Number: 5,936,432
[45] Date of Patent: Aug. 10, 1999

[54] HIGH SPEED LOW POWER AMPLIFIER CIRCUIT

[75] Inventors: Jong-Hoon Oh, Fremont; Sitaram Kamath, San Jose, both of Calif.

[73] Assignee: Hyundai Electronics America, Inc., San Jose, Calif.

[21] Appl. No.: 08/954,248

[22] Filed: Oct. 20, 1997

[51] Int. Cl.$^6$ .................................................. G11C 7/06
[52] U.S. Cl. ................................. 327/55; 327/52; 327/57
[58] Field of Search ........................................ 327/51–57

[56] References Cited

U.S. PATENT DOCUMENTS

| | | |
|---|---|---|
| 5,057,718 | 10/1991 | Proebsting ................................. 327/52 |
| 5,457,657 | 10/1995 | Suh ........................................ 365/205 |
| 5,546,026 | 8/1996 | Lin et al. ................................... 327/54 |
| 5,654,928 | 8/1997 | Lee et al. ................................. 365/205 |

*Primary Examiner*—Toan Tran
*Attorney, Agent, or Firm*—Townsend and Townsend and Crew LLP

[57] ABSTRACT

An amplifier circuit that maintains high speed and reduces power consumption while operating with reduced voltages is disclosed. Broadly, the amplifier circuit of the present invention includes a set-up circuit that performs a level shift on the input signal and applies it to the inputs of a sense amplifier in a cross-coupled fashion. The circuit operates such that one leg of the precharged sense amplifier output discharges in response to the input without a counteracting charging action by the other leg of the sense amplifier output. The amplifier circuit thus operates at higher speed and with no crowbar current even with input signals of smaller magnitude.

20 Claims, 3 Drawing Sheets

HIGH SPEED LOW POWER AMPLIFIER CIRCUIT

BACKGROUND OF THE INVENTION

The present invention relates in general to integrated circuits, and in particular to a high speed, low power amplifier circuit that is particularly suitable for use in semiconductor memories.

Higher density semiconductor memories are typically partitioned into a number of separate individual arrays. In Mega bit (e.g., 16M, 64M, or 256M) dynamic random access memories (DRAMs), for example, a typical individual array may include 256 rows (or word lines) and 1028 columns (or bit lines) of memory cells, to make a 256K individual array. Bit line sense amplifiers are located between arrays and may be shared by bit lines in two separate arrays. Each array also includes dedicated pairs of local data buses over which read and write transactions are carried out with selected bit line sense amplifiers. Bit lines are selected by decoding column addresses. The output of the column address decoder couples each pair of data buses to a single bit line sense amplifier. The number of pairs of local data buses in each array, the size and number of the arrays, the number of sense amplifiers all vary depending on the bit organization and type of memory architecture used.

A preferred technique to selecting bit line sense amplifiers in higher density memories has been to employ global column decoders. The outputs of a global column decoder typically extend over and are shared by multiple arrays. An output of the global column decoder, when asserted, couples the sense amplifier for the addressed column to a corresponding pair of local data buses in each array. However, data transaction occurs only in an array that is active. For the arrays that are not activated, all bit lines and local data buses are precharged to the same voltage level VBLP, which may be, for example, one half of the power supply voltage Vcc. Thus, in the inactive arrays, even if column decode switches are turned on to couple bit line sense amplifiers to local data buses, there should be no charge transferred since the bit lines and the data buses are all at the same precharge voltage level VBLP.

In the active array, an asserted global column decoder output turns on a column decode switch which is typically an n-channel transistor. Thus a selected bit line sense amplifier couples to a corresponding pair of data buses through the source/drain terminals of a pair of n-channel column switch transistors. In a read cycle, for example, the signal on the bit lines is transferred to the data buses, and is then sensed and amplified by a data bus sense amplifier. The output of the data bus sense amplifier is the read data that is transmitted to the output via a data output buffer.

Memory circuits commonly use the conventional differential amplifier with current-mirror loads, or dynamic differential amplifier with cross-coupled loads to implement the data bus sense amplifier. Such conventional data bus sense amplifiers commonly employ n-channel transistors as the differential input devices that receive the differential read data on the complementary data buses. It is well known that the voltage gain of such a differential amplifier with n-channel input devices is maximized when the common-mode voltage level is close to Vcc. Thus, for higher gain and faster operation, it is desirable to precharge the data bus input lines to the sense amplifier to a level closer to Vcc. Accordingly, many of today's multi-Mega bit memory circuits are designed such that the data buses in an activated array are charged up to close to Vcc, immediately before a read operation. During row address strobe (RAS) precharge cycle, the same data buses are discharged back down to VBLP. All data buses in inactive arrays remain at VBLP throughout the operation opening and closing a row.

Increased power consumption due to the repeated charging and discharging of the data buses, however, is one drawback associated with the Vcc-clamped data bus approach. In particular, as the memory density approaches Giga bit levels and the number of arrays that are active at the same time increases, this power consumption becomes a more serious concern.

Moreover, recently, memory circuits with a wide variety of design architectures and specifications have been developed, some of which require repeating this charge and discharge operation with the column cycle time period. Since the column cycle time period is one fifth or sixth of a typical RAS cycle time, power consumption increases yet further.

In general, with faster column cycle times (as in for example synchronous DRAM), and larger number of simultaneously active data buses (as in for example RAMBUS DRAM), the contribution of this charging and discharging of the data buses to power consumption becomes quite significant.

One might consider doing away with charging of the data buses to Vcc, and maintaining data bus precharge level at VBLP for a read operation. However, this approach poses other problems. Lowering the voltage level on the data buses from Vcc to about one half Vcc results in decreased drain-to-source voltage (Vds) across column decode switch transistors. This slows down the time it takes for the signal to develop on the data lines, adding to read cycle time.

A more serious problem with VBLP precharged data buses, however, is posed by the trend toward decreased power supply voltage levels. At 64 Mega bit levels, it is common to design the core of the memory circuit to operate at 2.5v, with a worst case value of 2.2v. Given a typical value of 0.8v for the threshold voltage of the NMOS transistor (Vtn), the turn-on voltage applied to the gate of NMOS input transistors of the data bus sense amplifier may be as low as [(2.2v/2)−0.8v]=0.3v. The turn-on voltage can be actually somewhat lower because VBLP is typically smaller than Vcc/2 to improve the memory cell margin for storing a logic "1" level. At such reduced input voltages, the gain and the speed of operation of the data bus sense amplifier suffer significantly.

Employing low-Vtn devices at the input of the data bus sense amplifier appreciably increases the speed of operation. However, controlling the threshold level for low-Vt devices within the allowable limits has proven to be problematic in mass production. Moreover, such devices require additional masks and process steps, which makes the manufacturing process more complex and more expensive.

There is therefore a need for a fast and efficient sense amplifier circuit with lower power consumption.

SUMMARY OF THE INVENTION

The present invention offers an amplifier circuit that maintains high speed while operating with reduced voltages. Broadly, the amplifier circuit of the present invention includes a set-up circuit that performs a level shift on the input signal and applies it to the inputs of a sense amplifier in a cross-coupled fashion. The circuit operates such that one leg of the precharged sense amplifier output discharges in response to the input without a counteracting charging action by the other leg of the sense amplifier output. The amplifier circuit thus operates at higher speed even with input signals of smaller magnitude.

Accordingly, in one embodiment, the present invention provides an amplifier circuit that receives a difference signal on first and second input lines, and includes a sense amplifier circuit having first and second input transistors respectively coupled to the first and second input lines, and set-up circuit having inputs and outputs cross-coupled between the first and second input lines and the first and second input transistors, wherein, the set-up circuit operates in response to the difference signal to provide an increased drive voltage for one of the input transistors while turning off the other of the input transistors.

The sense amplifier circuit further includes first and second pass transistors that respectively couple the first and second input transistors to the first and second input lines, and a cross-coupled pair of transistors that couple the first and second input transistors to a source voltage. A precharge circuit couples sense amplifier outputs to a precharge signal.

The set-up circuit includes a first level shift circuit coupling the first input line to the second input transistor of the sense amplifier circuit, and a second level shift circuit coupling the second input line to the first input transistor of the sense amplifier circuit.

A better understanding of the nature and advantages of the amplifier circuit of the present invention may be gained by reference to the detailed description and the drawings below.

DESCRIPTION OF SPECIFIC EMBODIMENTS

Figure 1:
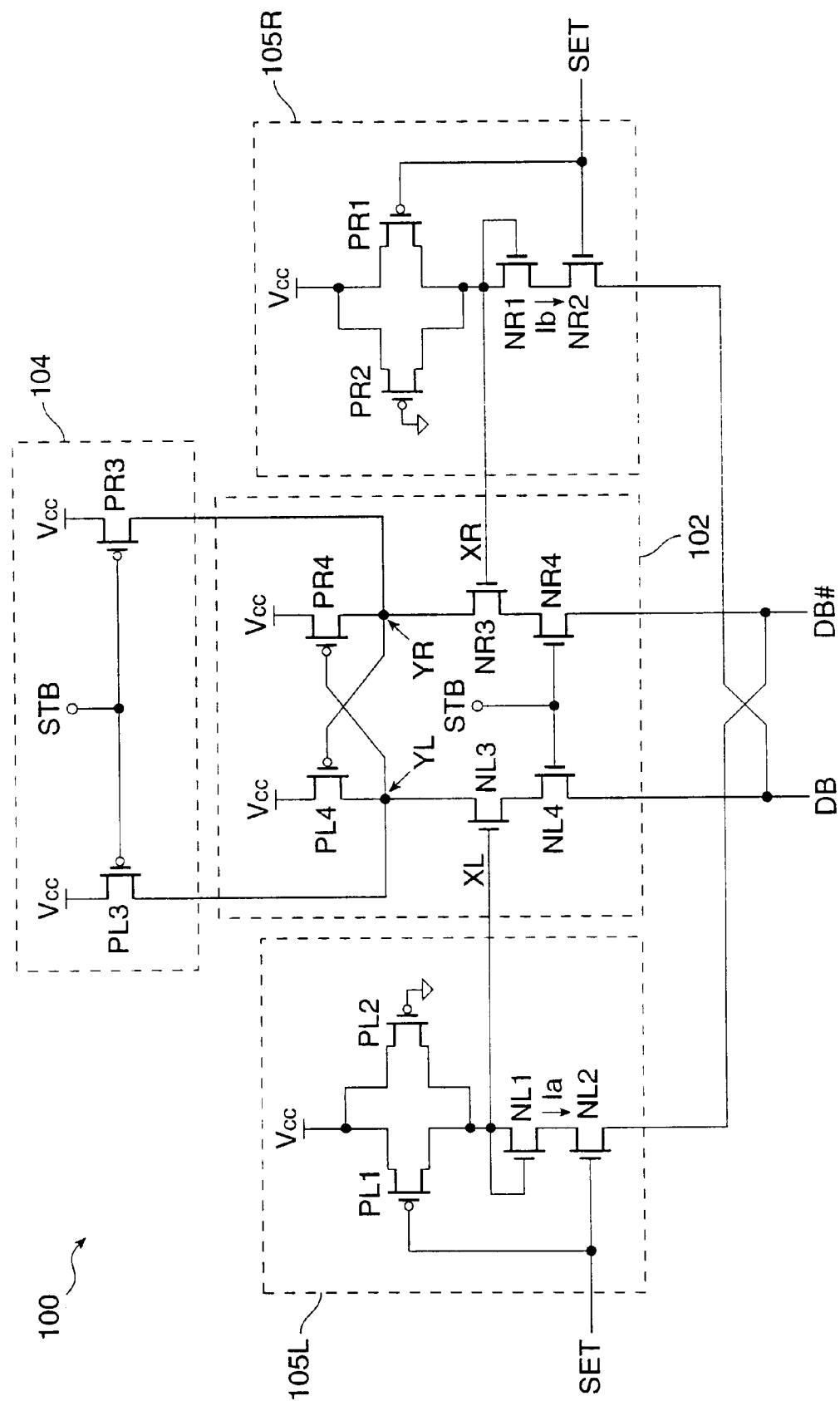
FIG. 1 is a circuit diagram of one embodiment of the amplifier circuit of the present invention.

Referring to FIG. 1, there is shown a circuit diagram of an amplifier circuit 100 according to one embodiment of the present invention. Amplifier circuit 100 includes a sense amplifier 102 that includes input transistors NL3 and NR3. Input transistors NL3 and NR3 respectively receive the signals on input lines DB and DB# via pass transistors NL4 and NR4, in response to a strobe signal STB. A cross-coupled pair of transistors PL4 and PR4 respectively connect the other source/drain terminals of NL3 and NR3 (nodes YL and YR) to the power supply Vcc. A precharge circuit 104 includes transistors PL3 and PR3 that respectively connect nodes YL and YR to a precharge voltage (Vcc in the example shown) in response to the strobe signal STB.

Amplifier circuit 100 further includes a set-up circuit made up of circuit 105L for the NL3 input and circuit 105R for the NR3 input to sense amplifier 102. Set-up circuit 105 connects between the inputs of sense amplifier 102 and input lines DB and DB# in a cross-coupled fashion as shown. Set-up circuit 105L includes three series transistors NL2, NL1 and PL1 connected between DB# and the power supply Vcc. A fourth transistor PL2 connects in parallel with transistor P11. The gate terminals of NL2 and PL1 are driven by a control signal SET, the gate terminal of transistor NL1 connects to its drain terminal and the gate terminal of transistor PL2 connects to a low potential (e.g., ground). The output of set-up circuit 105R is provided at the common gate-drain terminal of transistor NL1 and connects to the gate terminal of input transistor NL3 at node XL. Set-up circuit 105R is constructed similar to circuit 105L. It connects between DB and Vcc, and has its output connecting to the gate terminal of input transistor NR3 at node XR.

Figure 2:
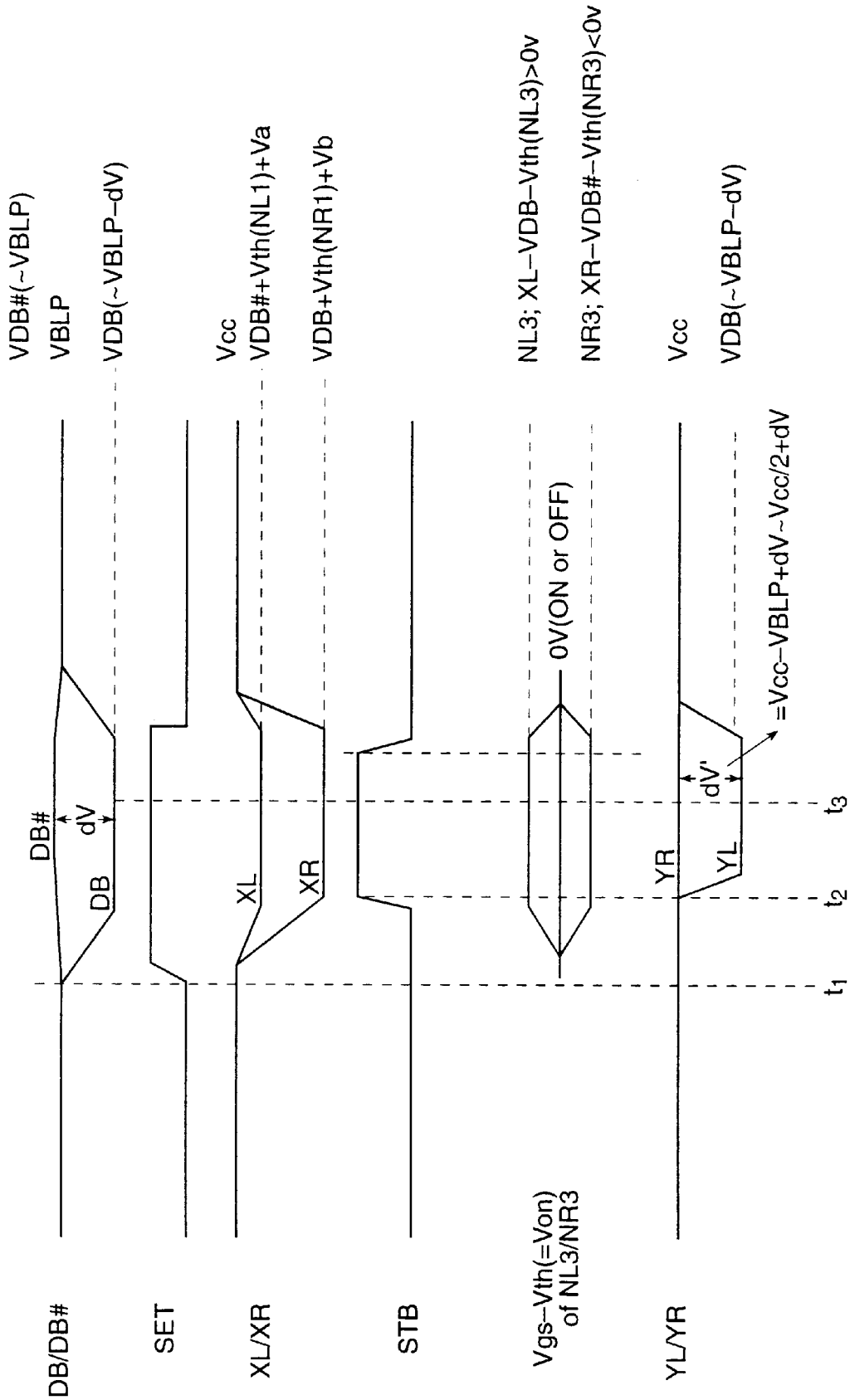
FIG. 2 is a timing diagram illustrating the operation of the embodiment of the present invention shown in FIG. 2.

The operation of the circuit of FIG. 1 is described hereinafter in greater detail in connection with the timing diagram of FIG. 2. Initially, the input lines DB and DB# are precharged to a voltage VBLP that is for example equal to half the power supply voltage Vcc. Set-up circuits 105L and 105R are disabled by keeping signal SET at a low potential (e.g., ground), which causes nodes XL and XR to be pulled to Vcc via PL1 and PR1. Sense amplifier circuit 102 is also precharged to Vcc by applying a low signal to STB which connects YL and YR to Vcc via transistors PL3 and PR3, and disconnects NL3 and NR3 from DB and DB# by turning off transistors NL4 and NR4. Thus, the outputs of the amplifiers YL and YR are initially at the precharge level, in this example, Vcc.

At time t1, a voltage difference dV starts to develop across the input lines DB and DB#. This may happen, for example, in a read cycle in a memory circuit where the content of an accessed memory cell cause the voltage difference between the two lines. An exemplary value for dV may be around 0.4–0.5 volts. In the example shown in FIG. 2, the signal on the DB line drops down by approximately dV (DB# moves up but by a negligible amount). Thus, by time t3, the voltage on DB# (VDB#) remains at about VBLP, while the voltage on DB (VDB) has dropped to about [VBLP-dV].

Set-up circuit 150 is activated by asserting the signal SET at about time t1, or shortly thereafter. With SET at a high level, transistors NL2 and NR2 are turned on providing a current path between the inputs XL and XR of sense amplifier 102 and the input lines DB# and DB, respectively. Input nodes XL and XR thus follow the curve of the signals on DB# and DB, respectively. The voltage level at the XL and XR input nodes are given by:

$$VXL = VDB\# + Vth_{(NL1)} + Va; \text{ and } \leftarrow \quad \text{Eqn. 1}$$

$$VXR = VDB + Vth_{(NR1)} + Vb, \leftarrow \quad \text{Eqn. 2}$$

where:

$Vth_{(NL1)}$ is the threshold voltage of transistor NL1 at bulk-to-source voltage Vbs=VDB#+|VBB| (where VBB is the substrate or bulk voltage);

$Vth_{(NR1)}$ is the threshold voltage of transistor NR1 at Vbs=VDB+|VBB|;

Va depends on the current Ia flowing through transistors NL1, and is given by the current drive ratio of transistors PL2 and NL1. With transistor PL2 being relatively small, Va approaches zero volts and is negligible, and Vb is similarly negligible.

Accordingly, the input nodes XL and XR follow the voltage on DB# and DB, but level shifted up by one threshold voltage Vth. Note, however, that due to a larger Vbs, the body effect causes $Vth_{(NR1)}$ to be greater than $Vth_{(NR1)}$.

At time t2, strobe signal STB is asserted activating sense amplifier circuit 102. This removes the precharge voltage from nodes YL and YR and connects the source terminals of NL3 and NR3 to DB and DB#, respectively. Examining the biasing condition of input transistor NL3 yields the following:

$Vo_{(NL3)} = Vgs - Vth = (VXL - VDB) - Vth_{(NL3)}$ (at Vs=VDB, where Vs is the source voltage of NL3).

Replacing the value for VXL given in equation 1 above in this equation yields:

$$Von_{(NL3)} = [VDB\# + Vth_{(NL1)}] - [VDB - Vth_{(NL3)}] = dV + dVth.$$

That is, with VDB at its source terminal and VXL at its gate terminal, the turn-on voltage for transistor NL3 is equal to dV+dVth. As described above, dVth must be positive because of different body effect for the two transistors due to different Vbs values. $Von_{(NL3)}$, therefore, is a positive voltage turning on transistor NL3 and causing node YL to discharge down to about the same level as VDB (i.e., ~VBLP-dV) as shown in FIG. 2.

An advantageous feature of the circuit of the present invention is that this switching of YL occurs without a counteracting charge current as is typical of the prior art sense amplifier circuits. That is, examining the bias condition of transistor NR3 reveals that this transistor is completely turned off during the discharge of YL through transistor NL3. Since there is no fighting between the two legs of the sense amplifier, the switching takes place very rapidly. Moreover, crowbar current is eliminated resulting in lower power consumption. The bias condition of transistor NR3 is given by:

$$Von_{(NR3)} = Vgs - Vth = (VXR - VDB\#) - Vth_{(NR3)}$$ (at Vs=VDB#, where Vs is the source voltage of NR3).

Replacing the value for VXR given in equation 2 above in this equation yields:

$$Von_{(NR3)} = [VDB + Vth_{(NR1)}] - [VDB\# - Vth_{(NR3)}] = -dV - dVth.$$

The drive voltage for transistor NR3 is therefore negative ensuring that this transistor is turned off while transistor NL3 discharges YL to about VBLP-dV. With transistor NR3 off, output node YR remains at its precharge potential, or Vcc. The resulting difference voltage dV' at the output of sense amplifier circuit 102 is given by:

$$dV' = VYR - VYL = Vcc - (VBLP - dV)$$

Assuming VBLP is at about one half Vcc, the final difference voltage at the output of sense amplifier 102 is equal to ½ Vcc+dV, or VBLP+dV. The output voltage dV' is then processed by an output stage that detects the corresponding logic value and generates the final output. Such an output stage may comprise a CMOS inverter stage with skewed transistor sizes to adjust its trip point. For example, by designing the p-channel transistor in the CMOS inverter stage to have a relatively larger current drive as compared to the n-channel transistor, the inverter trip point is lowered to detect VBLP-dV as a logic low input.

Figure 3:
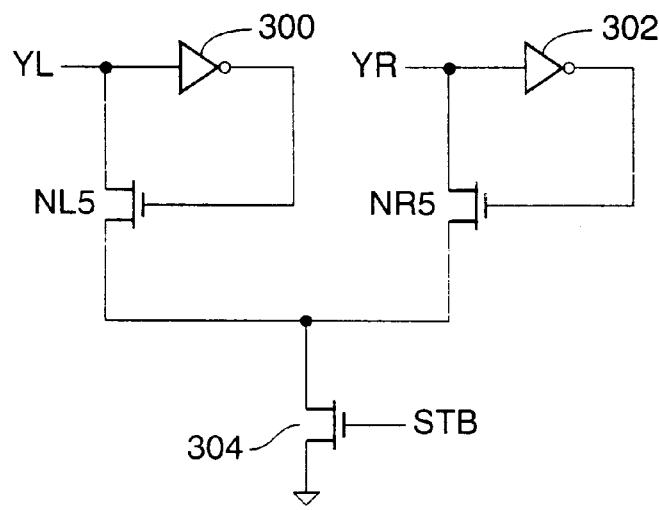
FIG. 3 is a circuit diagram of an alternative embodiment for the set-up circuit of the amplifier of the present invention.

Alternatively, amplifier circuit 100 may be followed by an output stage as shown in FIG. 3. In the circuit of FIG. 3, output nodes YL and YR are equipped with additional cross-coupled pull-down transistors NL5 and NR5 for pulling the output nodes all the way down to ground. This output stage operates in response to strobe signal STB that is applied to the gate terminal of a pull-down transistor 304. Inverters 300 and 302 drive the gate terminals of pull-down transistors NL5 and NR5. Amplifier circuit 100 generates a large enough difference signal dV' to allow the output circuit FIG. 3 to complete its function without much delay.

Figure 4:
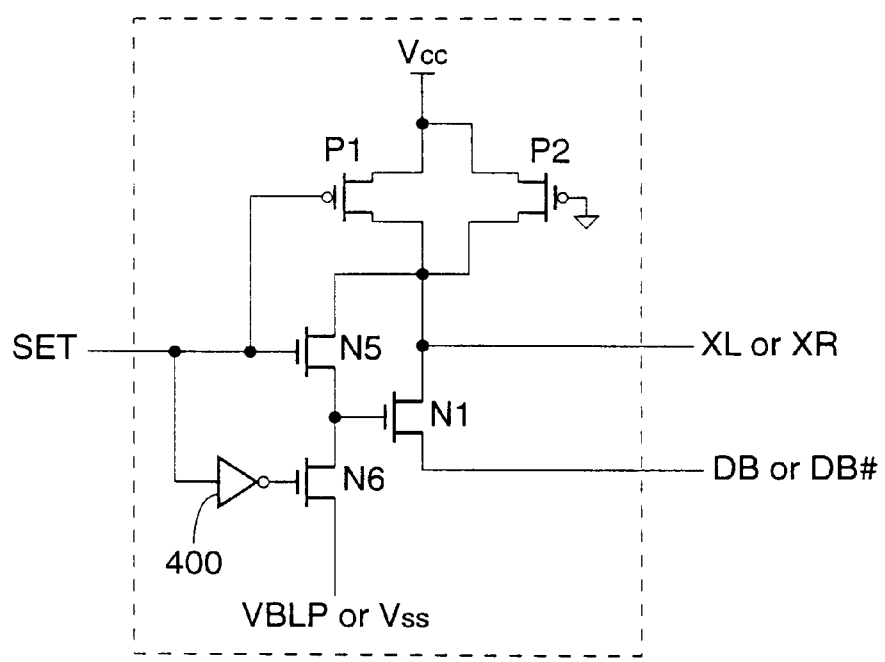
FIG. 4 is one embodiment of an output stage for use with the amplifier of the present invention.

FIG. 4 shows an alternative embodiment for a set-up circuit for one input of sense amplifier 102. The set-up circuit of FIG. 1 used a diode-connected n-channel transistor (NL1 or NR1) that connect a sense amplifier input (XL or XR) to one of the input lines (DB# or DB) in response to the signal SET. The set-up circuit of FIG. 4 instead creates a conditional diode in response to the signal SET, and eliminates one transistor from the current path between the inputs of sense amplifier 102 and the input lines DB and DB#. Referring to FIG. 4, when SET is asserted, transistor N5 turns on connecting the gate terminal of transistor N1 to its drain terminal. Thus, there is only one transistor N1 between input lines (DB or DB#) and sense amplifier inputs (XR or XL), and it provides for a one Vth level shift.

Thus, the present invention provides a low power high speed amplifier circuit that can operate with lower voltages. The amplifier includes a set-up circuit that not only provides a level shift to increase the current drive for the sense amplifier but eliminates the counteracting current path. While the above is a complete description of specific embodiments of the present invention, it is possible to use various alternatives, modifications and equivalents. For example, while in the specific circuit embodiment shown in FIG. 1 sense amplifier circuit 102 has n-channel input devices, the entire circuit could be designed with p-channel input transistors with the polarities of all other devices and signals reversed. Also the amplifier of the present invention may be used not only as a sense amplifier in memory circuits such as SRAMs and DRAMs, it can also be used as a fast and low power input buffer. Therefore, the scope of the present invention should be determined not with reference to the above description but should, instead, be determined with reference to the appended claims, along with their full scope of equivalents.

What is claimed is:

1. An amplifier circuit that receives a difference signal on first and second input lines, comprising:
   a sense amplifier circuit having first and second input transistors respectively coupled to the first and second input lines; and
   set-up circuit having inputs and outputs cross-coupled between the first and second input lines and the first and second input transistors,
   wherein, the set-up circuit operates in response to the difference signal to provide an increased drive voltage for one of the input transistors while turning off the other of the input transistors.

2. The amplifier circuit of claim 1 wherein the set-up circuit comprises:
   a first level shift circuit having a first terminal coupled to the first input line and a second terminal coupled to the second input transistor of the sense amplifier; and
   a second level shift circuit having a first terminal coupled to the second input line and a second terminal coupled to the first input transistor of the sense amplifier.

3. The amplifier circuit of claim 2 wherein each of the first and second level shift circuits comprises circuitry for shifting a signal level on a corresponding input line by about one threshold voltage of a transistor.

4. The amplifier circuit of claim 2 wherein each of the first and second level shift circuits comprises circuitry for coupling a diode element between a corresponding input line and a corresponding input transistor in response to a control signal.

5. The amplifier circuit of claim 4 wherein the diode element comprises an MOS transistor with a gate terminal coupled to a source/drain terminal.

6. The amplifier circuit of claim 2 wherein the sense amplifier further comprises:
   third and fourth transistors cross-coupled to said first and second transistors at output nodes of the sense amplifier;

a precharge circuit coupled to output nodes of the sense amplifier for precharging the output nodes in response to a precharge signal; and fifth and sixth transistors respectively coupling the first and second transistors to the first and second input lines in response to a strobe signal.

7. The amplifier circuit of claim 6 wherein the first, second, fifth and sixth transistors are MOS transistors of n-channel type, and the third and fourth transistors are MOS transistors of p-channel type, and wherein, the third and fourth transistors couple the output nodes of the sense amplifier to a power supply voltage when turned on.

8. The amplifier circuit of claim 7 wherein the first and second input lines are precharged to a predetermined level.

9. The amplifier circuit of claim 8 wherein the predetermined level is about one half the power supply voltage.

10. The amplifier circuit of claim 2 wherein each of the first and second level shift circuits comprises:

a diode-coupled MOS transistor having a first source/drain terminal coupled to a gate terminal of corresponding input transistor of the sense amplifier circuit;

a first pass transistor coupling a second source/drain terminal of the diode-coupled MOS transistor to a corresponding input line in response to a control signal; and a second pass transistor coupling the first source/drain terminal of the diode-coupled MOS transistor to a power supply voltage in response to the control signal.

11. The amplifier circuit of claim 2 wherein each of the first and second level shift circuits comprises:

a first transistor having a first source/drain terminal coupled to a gate terminal of a corresponding input transistor of the sense amplifier circuit, and a second source/drain terminal coupled to a corresponding input line;

a second transistor coupling the first source/drain terminal of the first transistor to a gate terminal of the first transistor in response to a control signal; and a third transistor coupling the first source/drain terminal of the first transistor to a power supply voltage in response to the control signal.

12. An amplifier circuit comprising:

a sense amplifier circuit including a first input transistor having a first source/drain terminal coupled to a first input line, and a second input transistor having a first source/drain terminal coupled to a second input line;

a first level shift circuit having a first terminal coupled the second input terminal and a second terminal coupled to a gate terminal of the first input transistor of the sense amplifier; and a second level shift circuit having a first terminal coupled to the first input terminal and a second terminal coupled to a gate terminal of the second input transistor of the sense amplifier.

13. The amplifier circuit of claim 12 wherein each one of the first and second level shift circuits comprises circuitry for shifting a voltage level on the corresponding input line by one transistor threshold voltage.

14. The amplifier circuit of claim 13 wherein the sense amplifier circuit further comprises:

second and third transistors coupling the first source/drain terminals of the first and second input transistors to the first and second input lines, respectively, and in response to a control signal; and fourth and fifth transistors coupling a second source/drain terminals of the first and second input transistors to a power supply line in a cross-coupled fashion.

15. The amplifier of claim 14 wherein the first and second input lines are precharged to about one half of the voltage level of the power supplied to the amplifier circuit.

16. The amplifier circuit of claim 13 wherein the circuitry in each of the first and second level shifting circuits comprises a diode-coupled MOS transistor coupled between a corresponding input line and a corresponding gate terminal of a sense amplifier circuit input transistor in response to a control signal.

17. A method of operating an amplifier circuit having first and second input transistors coupled to first and second input lines, the method comprising the steps of:

(A) generating a difference signal between the first and second input lines;

(B) applying the difference signal between a first source/drain terminal of the first input transistor and a first source/drain terminal of the second input transistor;

(C) level shifting the difference signal to a drive signal having a higher magnitude; and (D) turning on the first input transistor while turning off the second input transistor by applying the drive signal to gate terminals of the first and second input transistors in a cross-coupled fashion with respect to the difference signal.

18. The method of claim 17 wherein the step of level shifting comprises a step of shifting a magnitude of the signal by one transistor threshold voltage.

19. The method of claim 18 further comprising:

(E) discharging a first output node of the amplifier in response to the turning on of the first input transistor; and (F) maintaining a precharge voltage level on a second output node of the amplifier in response to the turning off of the second input transistor.

20. The method of claim 19 further comprising a step of precharging the first and second input lines to a voltage level about one half the level of the power supply voltage applied to the amplifier circuit.

* * * * *